United States Patent
Hsiao et al.

(10) Patent No.: US 7,560,744 B2
(45) Date of Patent: Jul. 14, 2009

(54) PACKAGE OPTICAL CHIP WITH CONDUCTIVE PILLARS

(75) Inventors: Wei-Min Hsiao, Kaohsiung (TW); Kuo-Pin Yang, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 224 days.

(21) Appl. No.: 11/646,292

(22) Filed: Dec. 28, 2006

(65) Prior Publication Data
US 2007/0158828 A1   Jul. 12, 2007

(30) Foreign Application Priority Data
Jan. 2, 2006   (TW) ............... 95100112 A (51) Int. Cl.
*H01L 31/12* (2006.01)

(52) U.S. Cl. .......... 257/98; 257/99; 257/432; 257/774; 257/E31.127

(58) Field of Classification Search .......... None
See application file for complete search history.

(56) References Cited

U.S. PATENT DOCUMENTS

| | | | |
|---|---|---|---|
| 7,262,475 B2* | 8/2007 | Kwon et al. | 257/433 |
| 2006/0171698 A1* | 8/2006 | Ryu et al. | 396/114 |
| 2007/0048902 A1* | 3/2007 | Hiatt et al. | 438/108 |
| 2008/0083980 A1* | 4/2008 | Yang et al. | 257/700 |

FOREIGN PATENT DOCUMENTS

| | | |
|---|---|---|
| TW | 478079 B | 3/2002 |
| TW | 595283 B | 6/2004 |
| TW | 200511534 A | 3/2005 |
| TW | I231606 | 4/2005 |
| TW | 200539431 | 12/2005 |

* cited by examiner

Primary Examiner—Alonzo Chambliss
(74) Attorney, Agent, or Firm—Rabin & Berdo, PC.

(57) ABSTRACT

A package structure and a fabricating method thereof are provided. The package structure includes a soft board and an optical chip. The soft board has a surface with a bump disposed thereon. The optical chip includes a main body and a conductive pillar. The main body has an active surface and a non-active surface opposite to the active surface. The active surface has a sensing area and a contact pad electrically connected with each other. The non-active surface is attached to the surface. The conductive pillar is disposed inside the main body, and penetrates the active surface and the non-active surface. The conductive pillar has a first end electrically connected to the contact pad and a second end electrically connected to the bump.

8 Claims, 7 Drawing Sheets

PACKAGE OPTICAL CHIP WITH CONDUCTIVE PILLARS

This application claims the benefit of Taiwan application Serial No. 095100112, filed Jan. 2, 2006, the subject matter of which is incorporated herein by reference.

BACKGROUND OF THE INVENTION

1. Field of the Invention

The invention relates in general to a package structure and a fabricating method thereof, and more particularly to a package structure including an optical chip with a conductive pillar and a fabricating method thereof.

2. Description of the Related Art

With the rapid development of semiconductor packaging technology, all kinds of chips are packaged in order to protect the chips, prevent the chips from moisture and electrically connect inner wires of the chips and wires of printed circuit boards. Among all kinds of chips, the optical chip especially needs well protection to prevent its sensing area from particle pollution. A conventional package structure with an optical chip is illustrated as follow.

Figure 1:
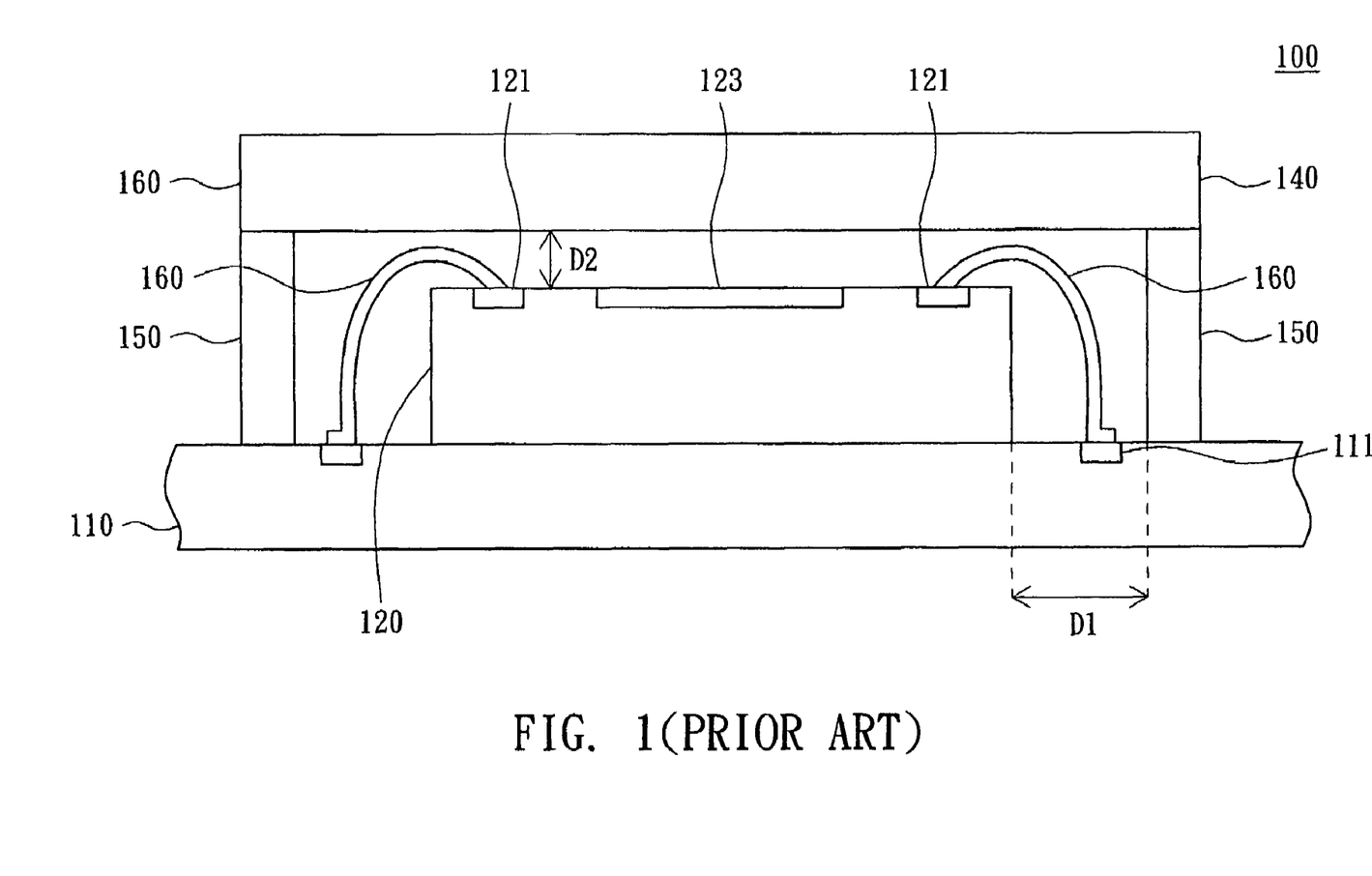
FIG. 1 (Prior Art) shows a conventional package structure.

FIG. 1 shows a conventional package structure. Please referring to FIG. 1, a package structure 100 includes a hard board 110, an optical chip 120, at least a bonding wire 160, a frame 150 and a glass board 140. The optical chip 120 including a sensing area 123 and at least a contact pad 121 is disposed on the hard board 110. The sensing area 123 is electrically connected to the contact pad 121. The bonding wire 160 is used for electrically connecting the contact pad 121 of the optical chip 120 and a solder pad 111 of the hard board 110. The frame 150 is disposed on the hard board 110 and outside the bonding wire 160. A predetermined distance D1 is between the frame 150 and the optical chip 120. The frame 150 having a predetermined height D2 supports the glass board 140 above the optical chip 120, for preventing the glass board 140 from pressing the top of the bonding wire 160.

Because the glass board 140 has to be disposed at the predetermined height D2 from the optical chip 120 for preventing the bonding wire 160 from being pressed, the frame 150 becomes a necessary component in the conventional optical package structure 100. Furthermore, the frame 150 is disposed at the predetermined distance D1 from the optical chip 120, and the hard board 110 is not flexible. As a result, the frame 150 increases not only the material cost but also the volume of the package structure 100. The package structure 100 cannot be bent to fit smaller space in an electronic device due to the hard board 110.

SUMMARY OF THE INVENTION

It is therefore an object of the invention to provide a package structure and a fabricating method thereof. An optical chip with a conductive pillar is used in the package structure of the invention, so that the optical chip is electrically connected to a board directly through the conductive pillar instead of wire bonding. Furthermore, a soft board is used in the package structure, and a transparent protection sheet is attached to the optical chip. Therefore, there is no need to use a frame. The cost and the volume of the package structure are both reduced. Moreover, the package structure can be bent to fit smaller space.

The invention achieves the above-identified object by providing a package structure including a soft board and an optical chip. The soft board has a surface with a first bump disposed thereon. The optical chip includes a main body and a conductive pillar. The main body includes an active surface and a non-active surface opposite to the active surface. The active surface includes a sensing area and a contact pad electrically connected to the sensing area. The non-active surface is attached to the surface of the board. The conductive pillar is disposed inside the main body and penetrates the active surface and the non-active surface. The conductive pillar has a first end electrically connected to the contact pad and a second end electrically connected to the first bump.

The invention achieves the above-identified object by providing a fabricating method of a package structure. First, a soft board is provided. The soft board has a surface with a first bump disposed thereon. Next, an optical chip is provided. The optical chip includes a main body and a conductive pillar. The main body includes an active surface and a non-active surface opposite to the active surface. The active surface includes a sensing area and a contact pad electrically connected to the sensing area. The conductive pillar is disposed inside the main body and penetrates the active surface and the non-active surface. The conductive pillar has a first end and a second end. The first end is electrically connected to the contact pad. Afterwards, the non-active surface is attached to the surface of the board to electrically connect the second end and the first bump.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 2:
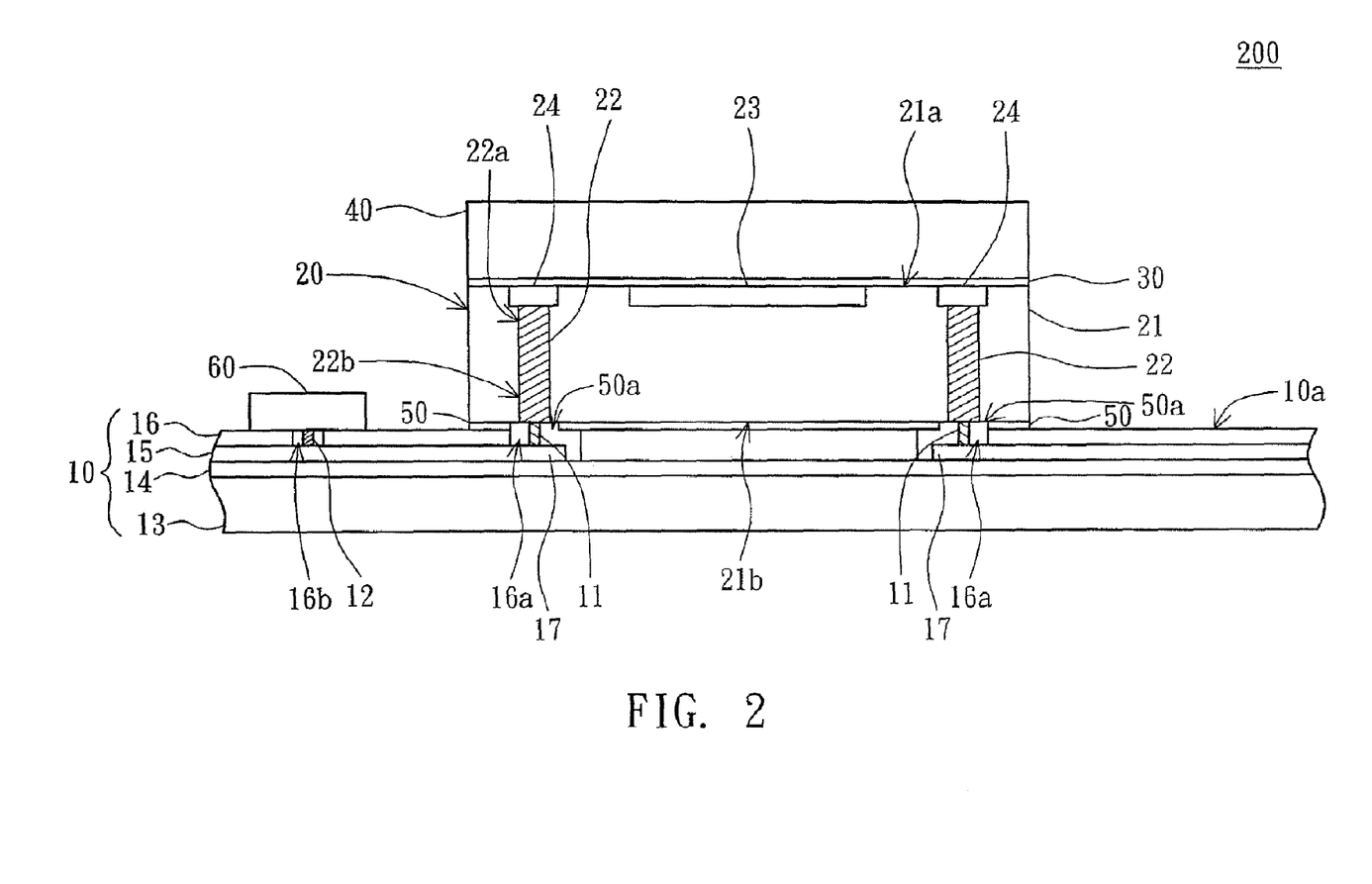
FIG. 2 illustrates a package structure according to a preferred embodiment of the present invention.

Please referring to FIG. 2, a package structure according to a preferred embodiment of the present invention is illustrated. A package structure 200 includes a soft board 10 and an optical chip 20. The optical chip 20 can be any kind of chip. For example, the optical chip 20 is a CMOS image sensor (CIS) in the present embodiment. The optical chip 20 is directly disposed on and electrically connected to the soft board 10.

The soft board 10 having a surface 10a includes a pad 17. At least a first bump 11 is disposed on the pad 17. In the present embodiment, two first bumps 11 are illustrated as an example. The optical chip 20 includes a main body 21 and at least a conductive pillar 22. The main body 21 has an active surface 21a and a non-active surface 21b opposite to the active surface 21a. The active surface 21a has a sensing area 23 and at least a contact pad 24 electrically connected the sensing area 23. In the present embodiment, two conductive pillars 22 and two contact pads 24 are illustrated as an example. The non-active surface 21b is attached to the surface 10a of the board 10. The conductive pillars 22 are disposed inside the main body 21 and penetrate the active surface 21a and the non-active surface 21b. Each conductive pillar 22 has a first end 22a and a second end 22b. Each first ends 22a is electrically connected to one contact pad 24. Each second end 22b is electrically connected to one first bump 11. Although the optical chip 20 includes two conductive pillars 22 in the present embodiment, the number of the conductive pillar 22 in the invention is not limited thereto. Wherein each first bump 11 is higher than the surface of the soft board, such that each first bump 11 can contact with each conductive pillars 22.

The structure of the soft board 10 is illustrated as follow. However, the invention is not limited thereto. The soft board 10 includes a base 13, a lower dielectric layer 14, a wire layer 15 and an upper dielectric layer 16. The lower dielectric layer 14 covers the base 13. The wire layer 15 is disposed over the lower dielectric layer 14. The upper dielectric layer 16 with two first apertures 16a covers a portion of the wire layer 15. The first apertures 16a expose a portion of the wire layer 15. The first bumps 11 are disposed in the first apertures 16a and electrically connected to the wire layer 15. In the present embodiment, the base 13 is made of polyimide (PI) as an example. However, anyone who has ordinary skill in the field of the invention can understand that the material of the base 13 is not limited thereto.

Moreover, a second aperture 16b exposing a portion of the wire layer 15 is preferably formed in the upper dielectric layer 16. The surface 10a further includes a second bump 12 disposed in the second aperture 16b and electrically connected to the wire layer 15. The package structure 200 further includes an electronic device 60 disposed on the upper dielectric layer 16 and electrically connected to the second bump 12.

Besides, the package structure 200 further includes a transparent protection sheet 40. The transparent protection sheet 40 is attached to the optical chip 20 and covers the active surface 21a. Preferably, the package structure 200 further includes a transparent glue layer 30. The transparent glue layer 30 is disposed between the transparent protection sheet 40 and the active surface 21a for adhering the transparent protection sheet 40 and the optical chip 20. Light can pass through the transparent protection sheet 40 and the transparent glue layer 30, so that the sensing area 23 receives light form the surroundings.

Preferably, the package structure 200 further includes an adhesive layer 50. The adhesive layer 50 is disposed between the non-active surface 21b and the surface 10a for adhering the optical chip 20 and the soft board 10. An opening 50a is formed in the adhesive layer 50 and exposes the second end 22b for electrically connecting the second end 22b and the first bump 11.

A fabricating method of a package structure of the present embodiment is illustrated as follow. However, the invention is not limited thereto.

Figure 3:
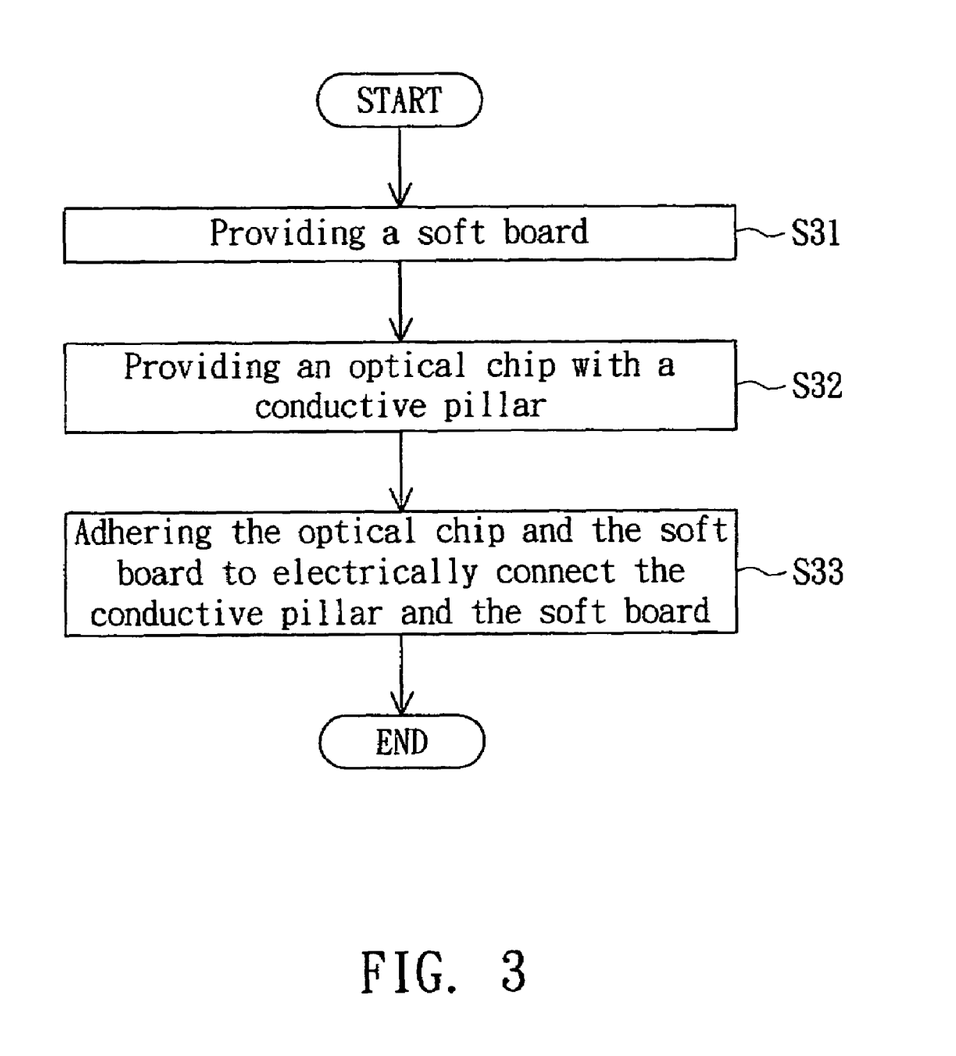
FIG. 3 illustrates a fabricating method of the package structure according to the preferred embodiment of the invention.

Please referring to FIG. 3, a fabricating method of the package structure according to the preferred embodiment of the invention is illustrated. First, in step S31, the soft board 10 in FIG. 2 is provided. Next, in step S32, the optical chip 20 with the conductive pillars 22 in FIG. 2 is provided. Then, in step S33, the non-active surface 21b of the optical chip 20 is attached to the surface 10a of the soft board 10 to electrically connect the second ends 22b and the first bump 11.

The step S32 of providing the optical chip 20 with the conductive pillars 22 is illustrated as follow. However, the invention is not limited thereto.

Figure 4:
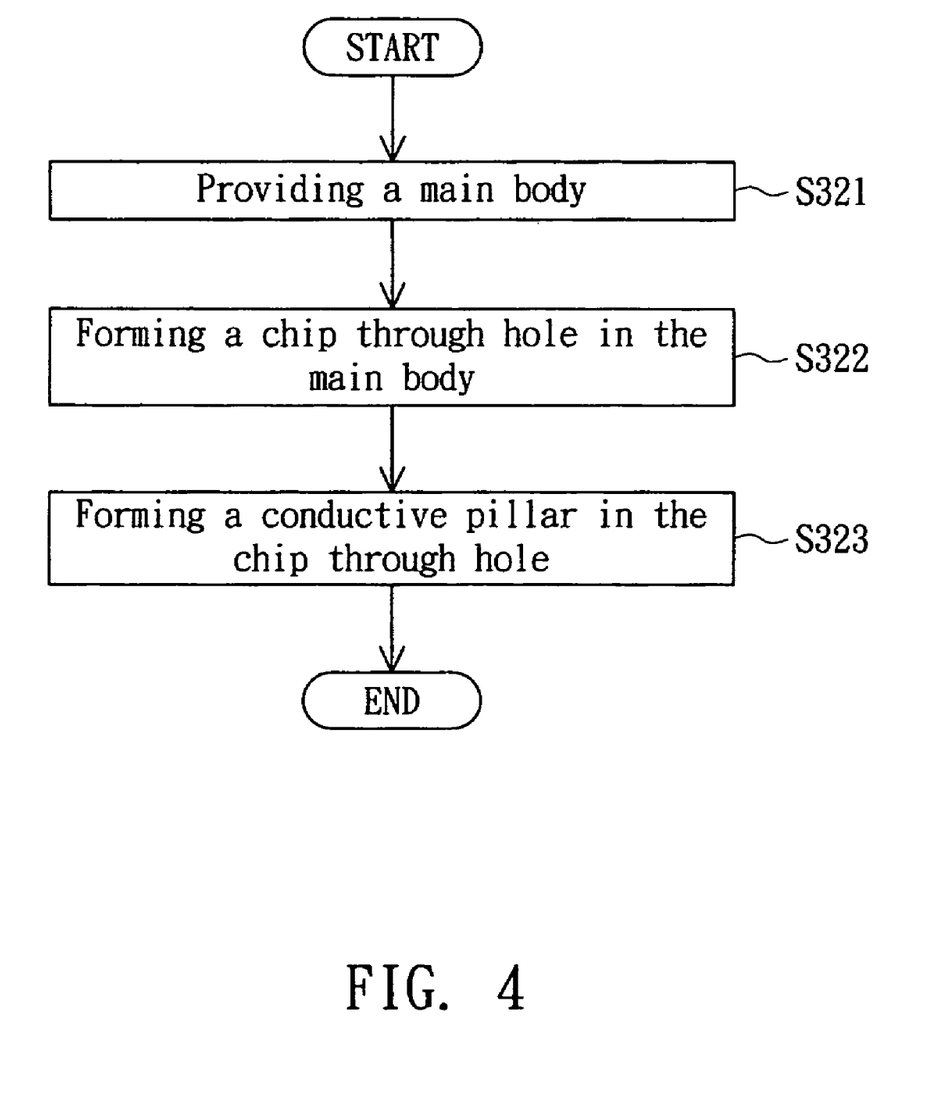
FIG. 4 illustrates a flow chart of the step S32 of providing an optical chip with conductive pillars in FIG. 3.
Figure 5A:
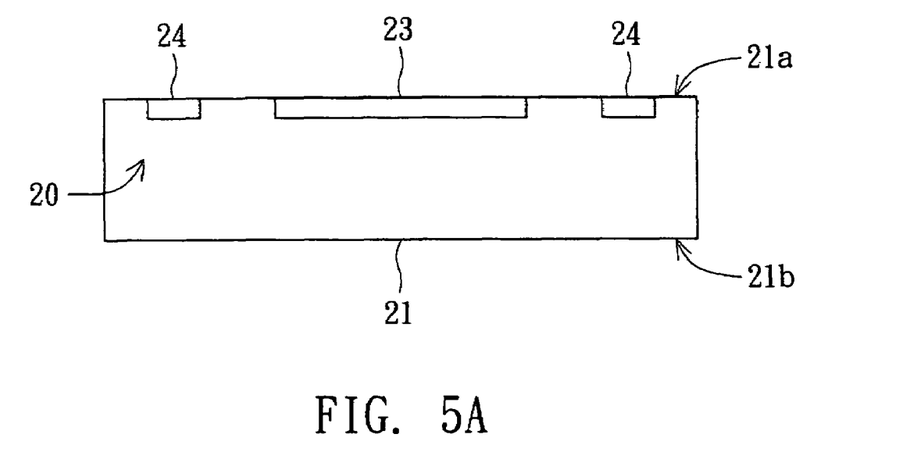
FIGS. 5A~5C illustrate the steps in FIG. 4.
Figure 5B:
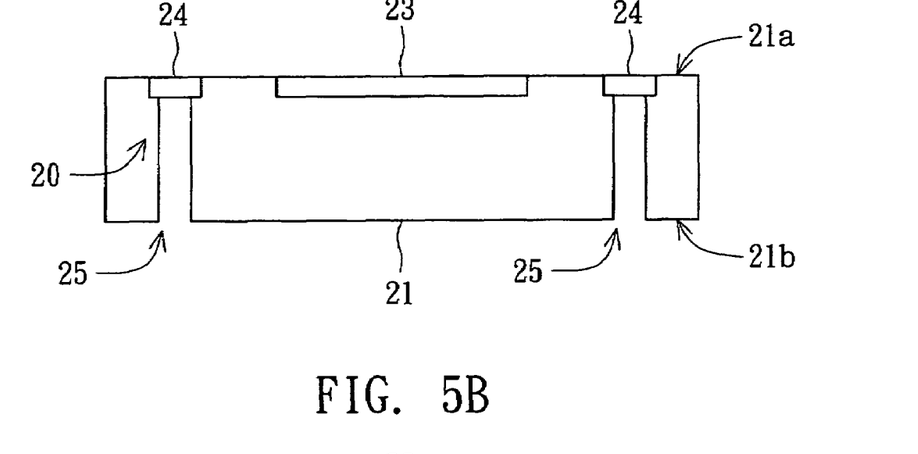
Figure 5C:
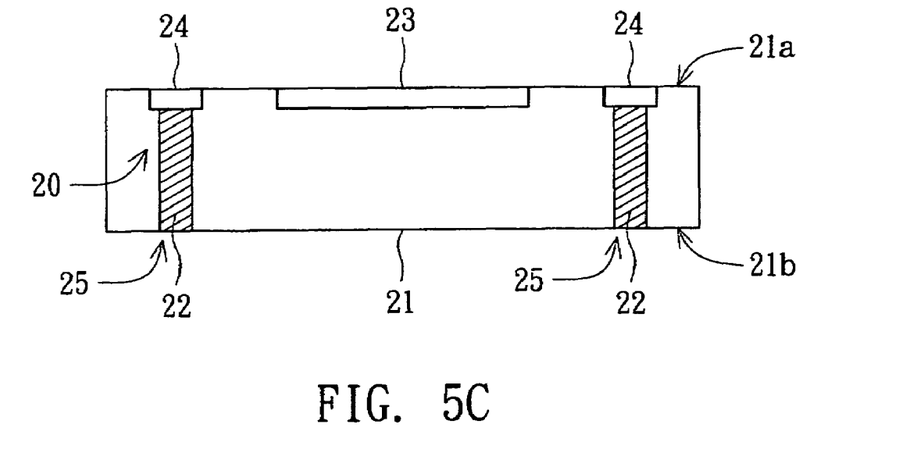

Please refer to FIG. 4 and FIGS. 5A-5C at the same time. FIG. 4 illustrates a flow chart of the step S32 of providing the optical chip with the conductive pillars. FIGS. 5A-5C illustrate the steps in FIG. 4. In step S321 in FIG. 4, the main body 21 is provided as shown in FIG. 5A. Then, in step S322 in FIG. 4, a portion of the main body 21 is removed to form two chip through holes 25, as shown in FIG. 5B. The chip through holes 25 are corresponding to the contact pads 24. The chip through holes 25 penetrate the active surface 21a but not the contact pads 24. Afterwards, in step S323 in FIG. 4, the conductive pillars 22 are formed in the chip through holes 25 as shown in FIG. 5C.

The step S323 of providing the optical chip 20 with the conductive pillars 22 including several sub-steps is illustrated as follow. However, the invention is not limited thereto.

Figure 6:
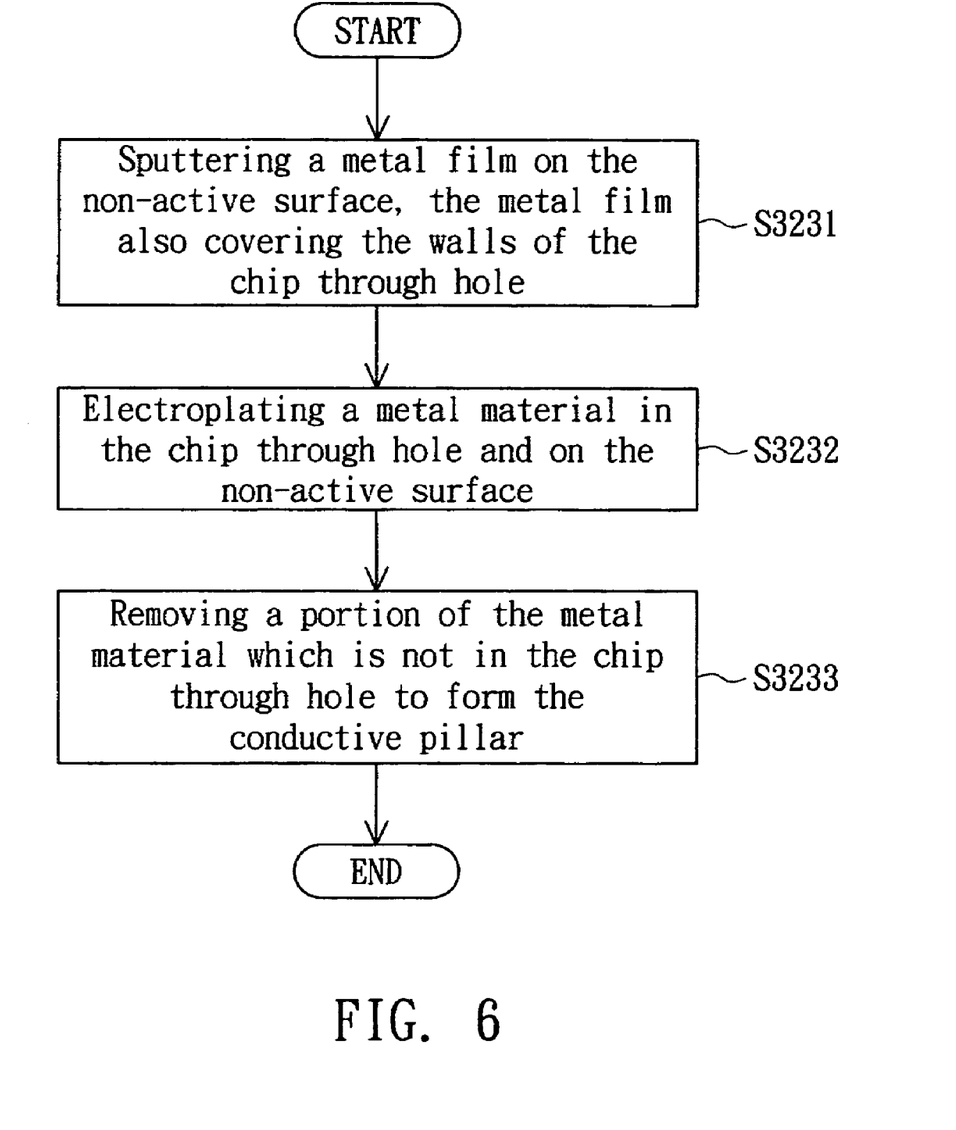
FIG. 6 illustrates the step S323 of forming the conductive pillars in FIG. 4.
Figure 7A:
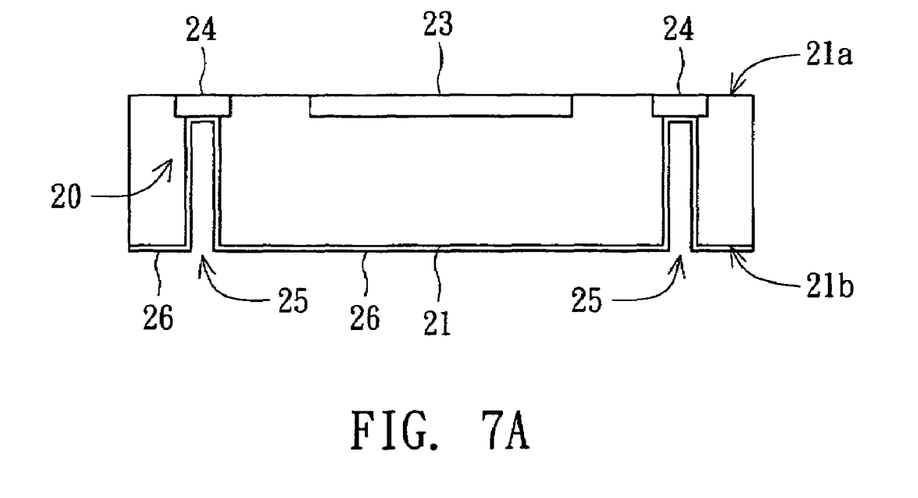
FIGS. 7A~7B illustrate the steps in FIG. 6.
Figure 7B:
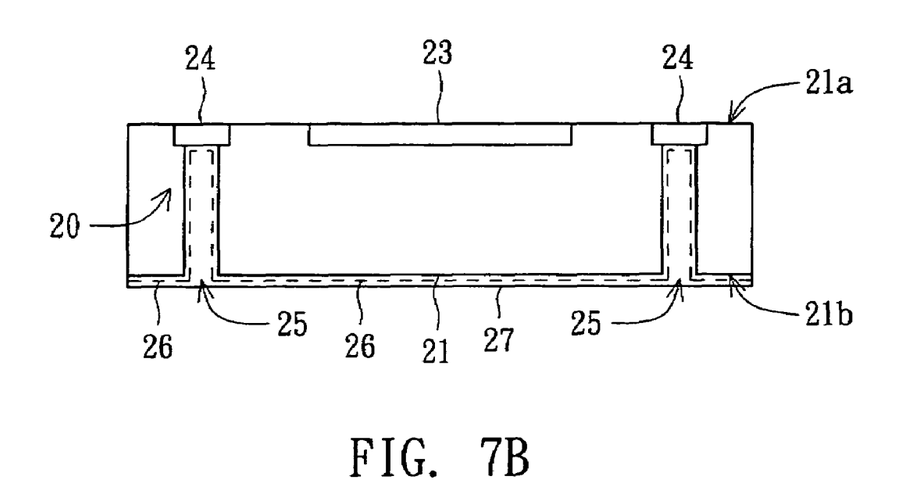

Please refer to FIG. 6 and FIGS. 7A~7B at the same time. FIG. 6 illustrates the step S323 of forming the conductive pillars in FIG. 4. FIGS. 7A~7B illustrate the steps in FIG. 6. The step S323 in FIG. 4 further includes the steps S3231, S3232 and S3233 in FIG. 6. In the step S3231 in FIG. 6, a metal film 26 is sputtered on the non-active surface 21a and covers the walls of the chip through holes 25, as shown in FIG. 7A. Then, in the step S3232 in FIG. 6, a metal material 27 is electroplated in the chip through holes 25 and on the non-active surface 21b, as shown in FIG. 7B. Thereon, please referring to FIG. 5C, in the step S3233 in FIG. 6, a portion of the metal material 27 which is not in the through holes 25 is removed to form the conductive pillars 22. As a result, the optical chip 20 with the conductive pillars 22 is formed.

Moreover, preferably the step S33 in FIG. 3 of adhering the optical chip 20 and the soft board 10 further includes following steps. First, the adhesive layer 50 is formed on the non-active surface 20b, as shown in FIG. 2. The adhesive layer 50 includes the openings 50a exposing the second ends 22b. Then, the adhesive layer 50 is attached to the surface 10a, so that the second ends 22b are electrically connected to the first bump 11.

Furthermore, the fabricating method of the package structure 200 further includes a step of disposing the electronic device 60 on the upper dielectric layer 16. The electronic device 60 is electrically connected to the second bump 12, as shown in FIG. 2.

Moreover, the step S32 in FIG. 3 preferably includes a step of adhering the transparent protection sheet 40 on the active surface 20a. First, the transparent glue layer 30 is formed on the active surface 20a, as shown in FIG. 2. Then, the transparent protection sheet 40 is adhered to the transparent glue layer 30, so that the transparent protection sheet 40 is attached to the active surface 20a.

In the package structure and the fabricating method thereof in the above embodiment of the invention, the optical chip is electrically connected to the board directly through the conductive pillars instead of wire bonding. The soft board is used in the package structure, and the transparent protection sheet is directly attached to the optical chip without the frame. As a result, the cost and the volume of the package structure are reduced. Furthermore, the structure package is able to fit smaller space by bending the soft board.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A structure package comprising:
   a soft board having a surface and a pad disposed thereon, the soft board comprising:
      a base;
      a lower dielectric layer covering the base;
      a wire layer disposed over the lower dielectric layer; and
      an upper dielectric layer covering a portion of the wire layer, a first aperture formed on the upper dielectric layer and exposing a portion of the wire layer where the pad is located;
   a first bump disposed on the pad and electrically connected to the wire layer; and
   an optical chip comprising:
      a main body comprising an active surface and a non-active surface opposite to the active surface, the active surface comprising a sensing area and a contact pad electrically connected to the sensing area, the non-active surface attached to the surface by an adhesive; and
      a conductive pillar disposed inside the main body and extending from the active surface to the non-active surface, the conductive pillar having a first end and a second end, the first end electrically connected to the contact pad, the second end electrically connected the first bump.

2. The package structure according to claim 1, wherein the base is made of polyamide (PI).

3. The package structure according to claim 1, wherein a second aperture is formed in the upper dielectric layer and exposes a portion of the wire layer, a second bump disposed on the surface of the soft board and in the second aperture, the second bump electrically connected to the wire layer, the package structure further comprising:
   an electronic device disposed on the upper dielectric layer and electrically connected to the second bump.

4. The package structure according to claim 1, wherein the first bump is higher than the surface of the soft board.

5. The package structure according to claim 1 further comprising:
   a transparent protection sheet attached to the optical chip and covering the active surface.

6. The package structure according to claim 5 further comprising:
   a transparent glue layer disposed between the transparent protection sheet and the active surface for adhering the transparent protection sheet and the optical chip.

7. The package structure according to claim 1 further comprising:
   an adhesive layer disposed between the non-active surface and the surface of the soft board, for adhering the optical chip and the soft board, wherein an opening formed in the adhesive layer exposes the second end for electrically connecting the second end and the first bump.

8. The package structure according to claim 1, wherein the optical chip is a CMOS image sensor (CIS).

* * * * *